(12) United States Patent
Higo et al.

(10) Patent No.: US 10,580,471 B2
(45) Date of Patent: *Mar. 3, 2020

(54) STORAGE ELEMENT AND STORAGE APPARATUS

(71) Applicant: Sony Corporation, Tokyo (JP)

(72) Inventors: Yutaka Higo, Kanagawa (JP);
Masanori Hosomi, Tokyo (JP);
Hiroyuki Ohmori, Kanagawa (JP);
Kazuhiro Bessho, Kanagawa (JP);
Tetsuya Asayama, Tokyo (JP);
Kazutaka Yamane, Kanagawa (JP);
Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/408,840

(22) Filed: May 10, 2019

(65) Prior Publication Data

US 2019/0267063 A1    Aug. 29, 2019

Related U.S. Application Data

(63) Continuation of application No. 15/943,361, filed on Apr. 2, 2018, now Pat. No. 10,332,577, which is a
(Continued)

(30) Foreign Application Priority Data

Nov. 30, 2011  (JP) .................................. 2011-261520

(51) Int. Cl.
*G11C 11/16* (2006.01)
*H01F 10/32* (2006.01)
(Continued)

(52) U.S. Cl.
CPC .......... *G11C 11/161* (2013.01); *G11B 5/3906* (2013.01); *G11B 5/3909* (2013.01);
(Continued)

(58) Field of Classification Search
CPC ....... H01L 43/02; H01L 27/228; H01L 43/08; G11B 5/3906; G11C 11/155;
(Continued)

(56) References Cited

U.S. PATENT DOCUMENTS 5,695,864 A    12/1997  Slonczewski
6,710,984 B1    3/2004  Yuasa et al.
(Continued)

FOREIGN PATENT DOCUMENTS

CN    101252037 A    8/2008
EP    2 182 532 A1    5/2010
(Continued)

OTHER PUBLICATIONS

International Search Report; International Application No. PCT/JP2012/006989; Date of completion of the International Search: Nov. 29, 2012.
(Continued)

*Primary Examiner* — Fernando Hidalgo
(74) *Attorney, Agent, or Firm* — Michael Best & Friedrich LLP

(57) ABSTRACT

A storage element includes a layer structure including a storage layer having a direction of magnetization which changes according to information, a magnetization fixed layer having a fixed direction of magnetization, and an intermediate layer disposed therebetween, which intermediate layer contains a nonmagnetic material. The magnetization fixed layer has at least two ferromagnetic layers having a direction of magnetization tilted from a direction perpendicular to a film surface, which are laminated and magneti-
(Continued)

cally coupled interposing a coupling layer therebetween. This configuration may effectively prevent divergence of magnetization reversal time due to directions of magnetization of the storage layer and the magnetization fixed layer being substantially parallel or antiparallel, reduce write errors, and enable writing operation in a short time.

4 Claims, 10 Drawing Sheets

Related U.S. Application Data continuation of application No. 15/658,862, filed on Jul. 25, 2017, now Pat. No. 9,997,698, which is a continuation of application No. 15/233,468, filed on Aug. 10, 2016, now Pat. No. 9,748,470, which is a continuation of application No. 14/354,760, filed as application No. PCT/JP2012/006989 on Oct. 31, 2012, now Pat. No. 9,444,034.

(51) Int. Cl.
| | |
|---|---|
| G11C 11/155 | (2006.01) |
| H01L 43/08 | (2006.01) |
| H01L 27/22 | (2006.01) |
| G11B 5/39 | (2006.01) |
| H01L 43/02 | (2006.01) |
| G11C 11/15 | (2006.01) |

(52) U.S. Cl.
CPC ............ *G11C 11/15* (2013.01); *G11C 11/155* (2013.01); *H01F 10/329* (2013.01); *H01F 10/3254* (2013.01); *H01F 10/3268* (2013.01); *H01F 10/3286* (2013.01); *H01L 27/228* (2013.01); *H01L 43/02* (2013.01); *H01L 43/08* (2013.01); *G11C 11/1675* (2013.01); *H01F 10/3272* (2013.01)

(58) Field of Classification Search
CPC . G11C 11/161; H01F 10/3254; H01F 10/329; H01F 10/3272; H01F 10/3286

USPC .............. 365/97, 131, 158, 209, 225.5, 171
See application file for complete search history.

(56) References Cited

U.S. PATENT DOCUMENTS

| | | | |
|---|---|---|---|
| 8,976,578 | B2 | 3/2015 | Higo et al. |
| 8,982,514 | B2 | 3/2015 | Nagasawa et al. |
| 9,032,808 | B2 | 5/2015 | Giddings et al. |
| 2007/0278547 | A1 | 12/2007 | Pietambaram et al. |
| 2009/0296462 | A1 | 12/2009 | Kent et al. |
| 2010/0109111 | A1 | 5/2010 | Shin et al. |
| 2011/0163739 | A1 | 7/2011 | Ono et al. |
| 2011/0292718 | A1* | 12/2011 | Suzuki ................... G11C 11/16 365/158 |

FOREIGN PATENT DOCUMENTS

| | | |
|---|---|---|
| JP | 2003-017782 | 1/2003 |
| JP | 2004-179187 A | 6/2004 |
| JP | 2008-192632 A | 8/2008 |
| JP | 2010-109372 A | 5/2010 |
| JP | 2011-175987 A | 9/2011 |
| WO | WO-2011/005484 A2 | 1/2011 |

OTHER PUBLICATIONS

Extended European Search Report dated Jun. 23, 2015 for corresponding European Application No. 12853396.5.
Japanese Office Action dated Aug. 18, 2015 for corresponding Japanese Application No. 2011-261520.
Chinese Office Action dated Apr. 28, 2016 for corresponding Chinese Application No. 2012800579121.
Chinese Office Action dated Nov. 4, 2016 for corresponding Chinese Application No. 201280057912.1.
Chinese Office Action dated Nov. 5, 2018 for corresponding Chinese Application No. 201710224149.1.

* cited by examiner

First Embodiment

STORAGE ELEMENT AND STORAGE APPARATUS

CROSS REFERENCES TO RELATED APPLICATIONS

The present application is a Continuation application of U.S. patent application Ser. No. 15/943,361 filed Apr. 2, 2018, which is a Continuation Application of U.S. patent application Ser. No. 15/658,862 filed Jul. 25, 2017, now U.S. Pat. No. 9,997,698 issued on Jun. 12, 2018, which is a Continuation application of U.S. patent application Ser. No. 15/233,468 filed Aug. 10, 2016, now U.S. Pat. No. 9,748,470 issued on Aug. 29, 2017, which is a Continuation application of U.S. patent application Ser. No. 14/354,760 filed Apr. 28, 2014, now U.S. Pat. No. 9,444,034 issued on Sep. 13, 2016, which is a 371 National Stage Entry of International Application No.: PCT/JP2012/006989, filed on Oct. 31, 2012, which in turn claims priority from Japanese Application No. 2011-261520, filed on Nov. 30, 2011, the entire contents of which are incorporated herein by reference.

TECHNICAL FIELD

The present disclosure relates to storage elements, and storage apparatuses, for recording by using spin-torque magnetization reversal.

BACKGROUND ART

With rapid development in various information devices from mobile terminals to large-capacity server, more and more improved performance such as high integration, high speed and low power consumption regarding the memory, logic, and other elements for making up such information devices has been pursued.

Specifically, remarkable progress has been made in semiconductor non-volatile memories, and flash memories as large-capacity file memories have come into wide use as if they can replace hard disks.

Meanwhile, considering expansion of the development into code storage and working memories as well, development of semiconductor non-volatile memories has been underway to replace NOR flash memories, DRAMs, and the like which have been currently generally used. Examples of the semiconductor non-volatile memories include FeRAM, (Ferroelectric Random Access Memory), MRAM (Magnetic Random Access Memory), PCRAM (phase change RAM) and the like. Some of them have already been implemented.

Among these non-volatile memories, MRAMs are capable of high-speed rewriting, and also almost infinite times (more than $10^{15}$ times) of rewriting, for they perform data storage by using magnetization direction of a magnetic material. They have already been utilized in the field of industrial automation, aircrafts and the like.

For their high-speed operation and reliability, MRAMs are expected to be developed in code storage and working memories hereafter.

However, MRAMs may still have a problem in achieving low power consumption and large capacity.

This may be a substantial problem coming from the principle of recording in MRAM, that is, a method of reversing magnetization by a current magnetic field produced by a wiring.

One example of the methods to cope with this problem under study is a recording method which does not depend on a current magnetic field (i.e., magnetization reversal). Among such studies, those regarding spin-torque magnetization reversal have been actively carried out (for example, see Patent Documents 1 and 2).

A storage element using the spin-torque magnetization reversal may be configured by MTJ (Magnetic Tunnel Junction), which is the same as in MRAMs.

This utilizes a fact that when spin-polarized electrons passing through a magnetic layer fixed to a certain orientation enter another magnetic free layer (without fixed orientation), the spin-polarized electron exert spin torque on the magnetic free layer. When a current above a certain threshold flows, a free magnetization layer (storage layer) would reverse its direction of magnetization.

Rewriting of 0/1 is made by changing the polarity of a current which is allowed to flow in the storage element.

An absolute value of the current for reversal of the direction of magnetization of the free magnetization layer is typically 1 mA or less in a 0.1 µm-scale storage element. Moreover, as this value of the current decreases proportionally to a volume of the storage element, scaling may be possible.

Furthermore, as it eliminates the need of word lines for producing the write current magnetic field, it may have an advantage that a cell structure can be simple.

Hereinafter, an MRAM using the spin-torque magnetization reversal will be referred to as "STT-MRAM (Spin Transfer Torque-Magnetic Random Access Memory)".

There is a great expectation in STT-MRAMs as non-volatile memories which are capable of realizing low power consumption and large capacity while keeping advantages of MRAMs where high speed and almost infinite times of rewriting is available.

Patent Document 1: Japanese Patent Application Laid-open No. 2003-17782

Patent Document 2: U.S. Pat. No. 5,695,864

DISCLOSURE OF THE INVENTION

Problem to be Solved by the Invention

In STT-MRAMs, a size of a spin torque which induces the magnetization reversal would vary depending on the direction of magnetization.

In normal structures of storage elements in STT-RAMs, a magnetization angle in which the spin torque is zero exists.

When a magnetization angle in the initial state coincides with such an angle, the time required for magnetization reversal would become significantly large. Consequently, there may be some cases that magnetization reversal is not completed within a write time.

If the reversal is not completed within the write time, such writing operation would result in failure (write error), where a normal write operation cannot be performed.

An object of the present disclosure is to provide a storage element and a storage apparatus capable of effectively preventing generation of errors and performing writing operation in a short time.

Means for Solving the Problem

In order to solve the problems described above, a storage element according to the present disclosure is configured as in the following.

That is, the storage element according to the present disclosure includes layer structure. The layer structure at least includes a storage layer having a direction of magnetization to be changed according to information, a magnetization fixed layer having a fixed direction of magnetization, and an intermediate layer containing a nonmagnetic material disposed between the storage layer and the magnetization fixed layer. Recording of the information is to be performed by allowing a current to flow in the layer structure in its lamination direction to cause change in the direction of magnetization of the storage layer.

The magnetization fixed layer has two ferromagnetic layers laminated interposing a coupling layer therebetween, the ferromagnetic layers being magnetically coupled interposing the coupling layer, the ferromagnetic layers having a direction of magnetization being tilted from a direction perpendicular to a film surface.

Furthermore, a storage apparatus according to the present disclosure includes the storage element according to the present disclosure, and a wiring portion for supplying a current which flows in the lamination direction to the storage element, and a current supply control section for controlling supply of the current to the storage element via the wiring portion.

As described above, in the storage element according to the present disclosure, the direction of magnetization of the ferromagnetic layers forming the magnetization fixed layer is tilted from a direction perpendicular to the film surface. This makes it possible to effectively prevent expansion of magnetization reversal time due to a state where the directions of magnetization of the storage layer and the magnetization fixed layer become substantially parallel or antiparallel. That is, it makes it possible to perform writing of information by reversing the direction of magnetization of the storage layer in a predetermined finite time.

Further, the storage apparatus according to the present disclosure allows a current to flow through the wiring portion to the storage element in the lamination direction, and thus enables to perform writing of information by reversing the direction of magnetization of the storage layer.

Effects of the Invention

According to the present disclosure, as it makes it possible to perform writing of information by reversing the direction of magnetization of the storage layer in a predetermined time, write errors can be reduced and writing operation may be made in a shorter time.

Since the write errors can be reduced, it can improve reliability of writing operation.

Further, since the writing operation may be made in a shorter time, it can realize high-speed operation.

Therefore, according to the present disclosure, it makes it possible to realize a storage apparatus and a storage apparatus which are highly reliable in writing operation and operate at high speed.

MODE(S) FOR CARRYING OUT THE INVENTION

Hereinafter, some embodiments of the present disclosure will be described in the following order.
[1. Schematic Configuration of Storage Apparatus of Embodiment]
[2. Overview of Storage Apparatus of Embodiment]
[3. First Embodiment (Specific Configuration Example 1)]
[4. Second Embodiment (Specific Configuration Example 2)]
[5. Simulation Result]
[6. Variation Examples]

1. Schematic Configuration of Storage Apparatus of Embodiment

First, a schematic configuration of a storage apparatus will be described.

Figure 1:
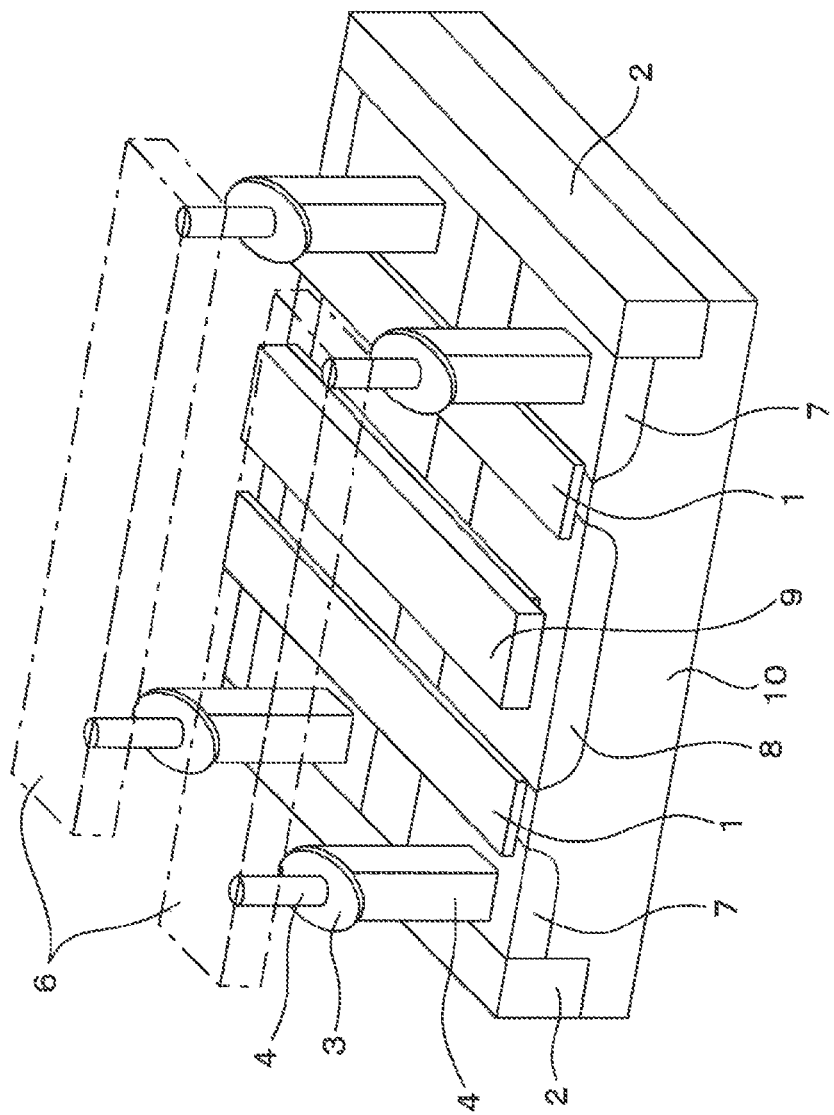
FIG. 1 A schematic perspective view of a storage apparatus of an embodiment.
Figure 2:
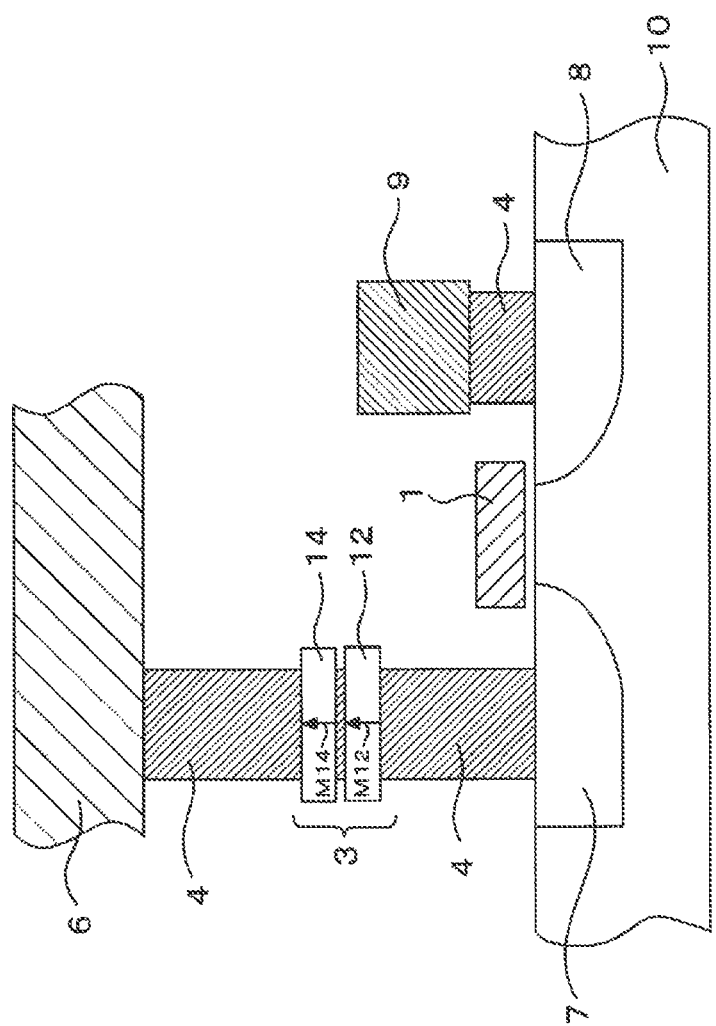
FIG. 2 A cross-sectional view of the storage apparatus of the embodiment.
Figure 3:
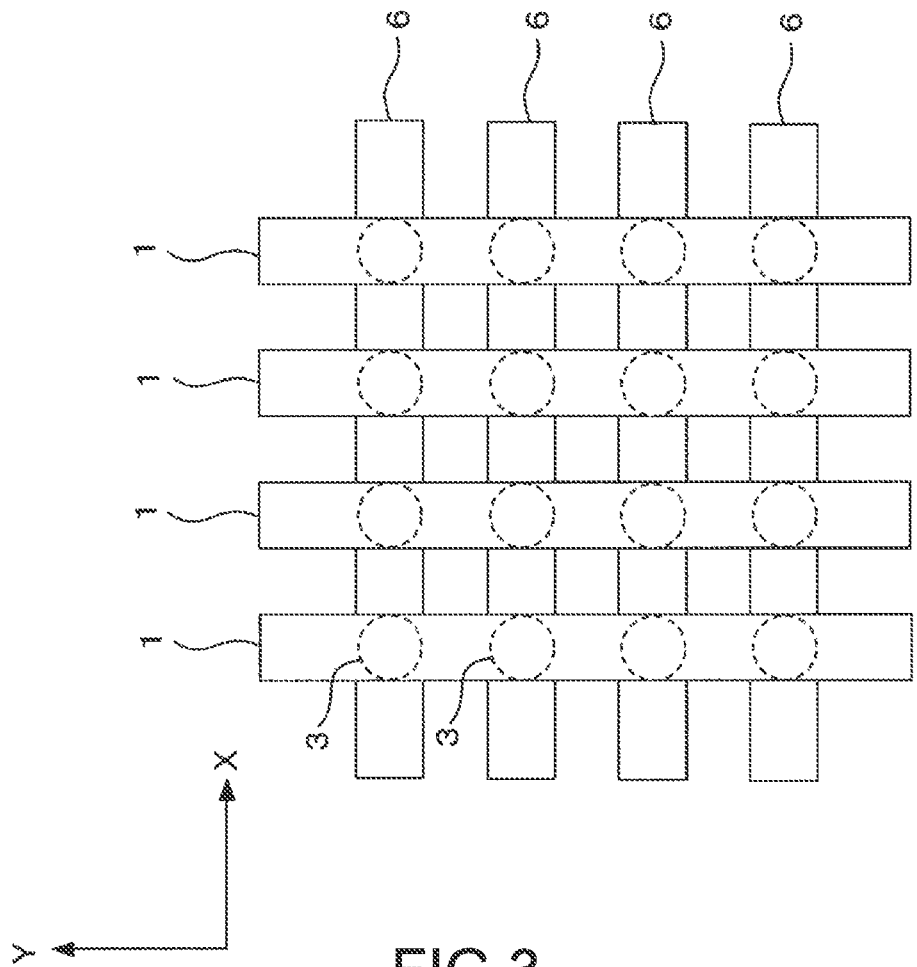
FIG. 3 A plan view of the storage apparatus of the embodiment.

Schematic drawings of the storage apparatus are shown in FIGS. 1 to 3. FIG. 1 is a perspective view; FIG. 2 is a cross-sectional view; and FIG. 3 is a plan view.

As shown in FIG. 1, a storage apparatus of an embodiment includes a storage element 3 made of STT-MRAM (Spin Transfer Torque-Magnetic Random Access Memory), which can hold information by a magnetization state, being disposed at each of intersections of two types of address wirings (for example, word lines and bit lines).

That is, to a portion which is isolated by element isolation layers 2 of a semiconductor substrate 10 such as a silicon substrate, there are a drain region 8, source region 7 and a gate electrode 1 being formed to make up each selection transistor for selecting each of the storage elements 3. Among the above, the gate electrodes 1 also serve as one of the address wirings (word lines) which extend in the forward-backward direction in the figure.

The drain region 8 is formed mutually in the selection transistors of right and left in FIG. 1. A wiring 9 is connected to this drain region 8.

Further, between each source region 7 and a bit line 6 extending from right to left in FIG. 1, the storage element 3 that includes a storage layer having a direction of magnetization to be reversed by spin-torque magnetization reversal is disposed. For example, this storage element 3 may be made of a magnetic tunnel junction element (MTJ element).

As shown in FIG. 2, the storage element 3 has two magnetic layers 12 and 14. Among the two magnetic layers 12 and 14, one magnetic layer will be a magnetization fixed layer 12 having a fixed direction of magnetization M12.

Another magnetic layer will be a magnetization free layer, that is, a storage layer 14 in which a direction of magnetization M14 can change.

Further, the storage element 3 is connected to the bit line 6 and the source region 7 via respective contact layers 4 above and under the storage element 3.

This would allow a current to flow via the two types of address wirings 1 and 6 to the storage element 3 in a vertical direction (lamination direction), and thus, the direction of magnetization M14 of the storage layer 14 can be reversed by spin-torque magnetization reversal.

As shown in FIG. 3, the storage apparatus is made with the storage elements 3 disposed at the respective intersections of a large number of first wirings (word lines) 1 and second wirings (bit lines) 6.

The storage element 3 may have a round planar shape and have a sectional configuration as shown in FIG. 2.

Further, the storage element 3 includes the magnetization fixed layer 12 and the storage layer 14.

With each storage element 3, a memory cell of the storage apparatus is formed.

In such a storage apparatus, writing should be performed at a current less than or equal to the saturation current of the selection transistor. Since the saturation current of the transistor is known to be lower with miniaturization, it would be favorable to improve the spin-transfer efficiency and reduce the current that flows through the storage element 3, for miniaturizing the storage apparatus.

Further, in order to produce a large readout signal, a high magnetoresistance change rate should be ensured, and for this purpose, it would be effective to employ an MTJ structure as mentioned above, that is, to employ a configuration of the storage element 3 where a tunnel insulating layer (tunnel barrier layer) is provided as an intermediate layer between the two layers of magnetic layers 12 and 14.

When thus employed the tunnel insulating layer as the intermediate layer, the current which can flow through the storage element 3 would be limited so that the tunnel insulating layer be prevented from breakdown. Accordingly, it would be favorable to reduce the current required for spin-torque magnetization reversal, also in view of ensuring reliability of the storage element 3 in repetition of writing. Incidentally, the current required for spin-torque magnetization reversal may also be called inversion current, storage current, and the like.

In addition, since the storage apparatus of the embodiment is a non-volatile memory device, it is demanded that the information written by the current be stably stored. In other words, stability against thermal fluctuations (heat stability) of magnetization of the storage layer 14 should be ensured.

If the heat stability of the storage layer 14 is not ensured, a direction of magnetization that has been reversed may be re-reversed due to heat (temperature in operating environment) and may result in retention error.

The storage element 3 (STT-MRAM) in this storage apparatus may have an advantage in scaling, as compared to the MRAM of the past, that is, the volume thereof may be reduced. However, provided that other characteristics be the same, a smaller volume of the element would tend to result in lower heat stability.

When realizing large capacity of STT-MRAM, the volume of the storage element 3 would be further reduced, and therefore, ensuring heat stability may be a major matter.

Accordingly, heat stability may be important characteristics for the storage element 3 in the STT-RAM, and the element should be designed so that the heat stability can be ensured while the volume thereof is reduced.

2. Overview of Storage Apparatus of Embodiment

Next, an overview of a configuration of the storage element 3 of the embodiment will be described.

First, referring to the cross-sectional view of FIG. 4, a schematic configuration of a storage element 3' having an STT-MRAM in the past, in which the direction of magnetization is perpendicular to the film surface, will be described.

It should be noted that, as can be understood from the description below, in the storage element 3 according to the present embodiment, the direction of magnetization M12 of the magnetization fixed layer 12 is not perpendicular to the film surface. However, in this illustration with reference to FIG. 4, the reference numeral "12" will be used for convenience to denote a magnetization fixed layer contained in the storage element 3' of the past.

Figure 4:
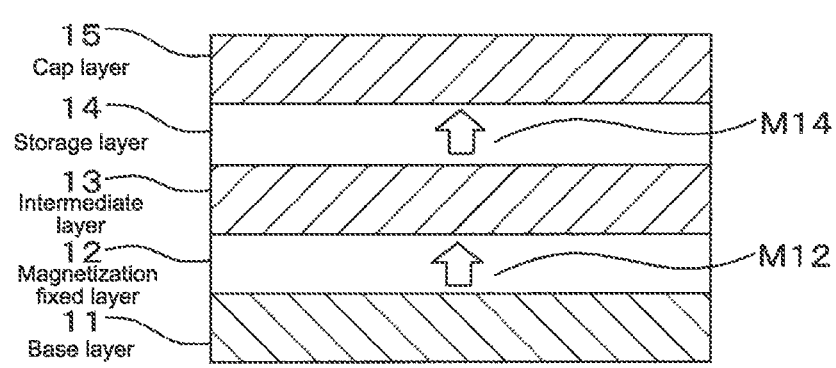
FIG. 4 An explanatory drawing (cross-sectional view) of a schematic configuration of an STT-MRAM in the past, in which the direction of magnetization is perpendicular to the film surface.

As shown in FIG. 4, the storage element 3' includes a base layer 11, and, a magnetization fixed layer (also called a reference layer) 12 having a fixed direction of magnetization M12, an intermediate layer (nonmagnetic layer: tunnel insulating layer) 13, the storage layer (magnetization free layer) 14 having a direction of magnetization M14 which is variable, and a cap layer 15, which are laminated on top of the base layer 11 in this order.

Among these, the magnetization fixed layer 12 has the direction of magnetization M12 thereof fixed, due to high coercive force and the like. In the illustration according to this figure, the direction of magnetization is fixed to a direction perpendicular to the film surface.

The storage element 3' may store information by the direction of magnetization (magnetic moment) M14 of the storage layer 14 having uniaxial anisotropy.

Writing of the information to the storage element 3' may be performed by allowing a current to flow in the direction perpendicular to the film surfaces of the layers of the storage element 3' (that is, the lamination direction of the layers), to cause spin-torque magnetization reversal in the storage layer 14.

Now, spin-torque magnetization reversal will be briefly described.

Electrons have two spin angular momentums. They can be preliminary defined as spin up and spin down.

A nonmagnetic material has the same number of spin-up electrons and spin-down electrons, in its inside. On the other hand, a ferromagnetic material has a difference in the number of spin-up electrons and spin-down electrons inside.

First, a case where two layers of ferromagnetic material (the magnetization fixed layer 12 and the storage layer 14), which are laminated interposing the intermediate layer 13, have their directions of the magnetizations M12 and M14 in an antiparallel state, and some electrons are moved from the magnetization fixed layer 12 to the storage layer 14, will be assumed.

In the electrons which have passed through the magnetization fixed layer 12, there would be a spin polarization, that is, a difference in the number of spin-up electrons and spin-down electrons.

If the intermediate layer 13 as a tunnel insulating layer is thin enough, the electrons may reach the other ferromagnetic material, which is the storage layer (magnetization free layer) 14, before the spin polarization relaxes and comes into a nonpolarized state (the same number of spin-up and spin-down) as in a normal nonmagnetic material.

Then, since the two layers of ferromagnetic material (the magnetization fixed layer 12 and the storage layer 14) have spin polarization degrees with opposite signs to each other, some of the electrons would be reversed, that is, they would change the direction of the spin angular momentum, in order to reduce energy of the system. At this time, since the total angular momentum of the system should be conserved, a reaction equal to the sum of changes in the angular momentum according to the electrons which changed the directions would be given to the magnetization M14 of the storage layer 14.

In cases where an amount of current, that is, the number of electrons passing per a unit of time is small, the total number of the electrons changing the directions would be small and the resulting change in the angular momentum which occurs to the magnetization M14 of the storage layer 14 would be small. However, if the current is increased, a large change in the angular momentum may be given per a unit of time.

A time change in the angular momentum is a torque, and when the torque exceeds a certain threshold, a precession of the magnetization M14 of the storage layer 14 would start. The magnetization M14 becomes stable after being turned by 180 degrees, due to the uniaxial anisotropy of the storage layer 14. That is, a reversal from the antiparallel state to the parallel state takes place.

On the other hand, in a case where the two layers 12 and 14 have their magnetizations M12 and M14 in a parallel state, when a current is allowed to flow in an opposite direction so that the electrons are sent from the storage layer 14 to the magnetization fixed layer 12, the electrons would be reflected by the magnetization fixed layer 12.

Then, the reflected electrons with the direction of the spin reversed would exert torque when they enter the storage layer 14. This allows the direction of magnetization M14 of the storage layer 14 to be reversed, and allows the directions of the magnetizations M12 and M14 to be reversed with respect to each other to come into the antiparallel state.

However, the amount of current required for causing reversal at this time would be greater than in the case of the reversal from the antiparallel state to the parallel state.

As the reversal from the parallel state to the antiparallel state is difficult to be understood intuitively, it can be considered that while the magnetization M12 of the magnetization fixed layer 12 cannot be reversed because the magnetization M12 is fixed, the direction of magnetization M14 of the storage layer 14 should be reversed for conservation of the angular momentum of a whole system.

In such a manner, the recording of 0/1 information would be performed by allowing the current above a certain threshold to flow, in the direction from the magnetization fixed layer (reference layer) 12 to the storage layer 14, or in the opposite direction. The threshold for each current corresponds to the polarity thereof.

Read-out of the information may be performed, as in a MRAM of the past, by using magnetoresistance effect.

That is, as in the above-described case of the recording of the information, a current is allowed to flow in the direction perpendicular to the film surfaces of the layers (lamination direction of the layers). Then, it uses the phenomenon that the electric resistance of the storage element 3' changes depending on whether the direction of magnetization M14 of the storage layer 14 is parallel or antiparallel with respect to the direction of magnetization M12 of the magnetization fixed layer (reference layer) 12.

The material to be used for the intermediate layer 13 as the tunnel insulating layer may be a metal, or may be an insulating material. However, one which may provide larger readout signal (resistance change rate), and which may enable recording with lower current, is the use of the insulating material as the intermediate layer 13. An element of such a case will be referred to as a ferromagnetic tunnel junction (Magnetic Tunnel Junction: MTJ) element.

The above-mentioned spin torque has a size that varies depending on an angle formed between the magnetization M14 of the storage layer 14 and the magnetization M12 of the magnetization fixed layer (reference layer) 12.

If a unit vector indicating the direction of magnetization M14 is m1 and a unit vector indicating the direction of magnetization M12 is m2, the size of the spin torque will be proportional to m1×(m1×m2). The sign "×" herein means the vector product.

Usually, the magnetization M12 of the magnetization fixed layer 12 is fixed in an easy magnetization axis of the storage layer 14. The magnetization M14 of the storage layer 14 tends to be directed along its own easy magnetization axis. At this time, m1 and m2 would form an angle of 0 degrees (parallel) or 180 degrees (antiparallel).

FIG. 4 illustrates the directions of the magnetizations M12 and M14 in a case where m1 and m2 form an angle of 0 degrees.

In cases where the angle formed by m1 and m2 is 0 degrees or 180 degrees, if it follows the above-mentioned formula of spin torque, the spin torque is not supposed to be working.

However, in actual, the magnetization M14 of the storage layer 14 is distributed randomly around the easy magnetization axis, because of the thermal fluctuation. Accordingly, when the angle of the magnetization M14 with respect to the magnetization M12 of the magnetization fixed layer 12 departs from 0 degrees or 180 degrees, it may allow the spin torque to work and cause the magnetization reversal.

Magnetic materials have a magnetic energy associated with the direction of magnetization thereof. The direction which corresponds to the lowest magnetic energy is the easy magnetization axis.

If there is no thermal fluctuation, a force (torque) which works to minimize the magnetic energy would work and cause the magnetization to be directed along the easy magnetization axis.

On the other hand, in cases where the direction of the magnetization is departed from the easy magnetization axis by the thermal fluctuation, the magnetic energy becomes greater than in the case of the magnetization in the easy magnetization axis. This difference of the magnetic energies will be referred to as "excitation energy E". When the direction of the magnetization further departs from the easy magnetization axis and causes the excitation energy E to exceed a certain threshold, the magnetization reversal occurs.

This threshold will be referred to as "Δ (delta)".

The above-mentioned Δ can be regarded as the energy required for causing the reversal of the magnetization. The unit of the excitation energy E and the Δ is joule (J), but hereinafter, the excitation energy E and the Δ will be divided by a heat energy (product of the Boltzmann constant and the absolute temperature), to be used as a dimensionless quantity. As the Δ expressed in this way can be regarded as an index which indicates the stability of magnetization against the heat energy, the Δ may also be referred to as an "index of heat stability".

By using the excitation energy E of the magnetization M14 of the storage layer 14 and the index of heat stability Δ, the relation between a flow of current I in the storage layer 14 and a time required for the spin-torque magnetization reversal (reversal time) is by this current I satisfies the following formula.

[Formula 1]

$$\frac{\eta(I - I_{c0})t_s}{e} = \left(\frac{M_s V}{\mu B}\right) \ln\left(\frac{\pi}{2}\sqrt{\frac{\Delta}{E}}\right) \quad \text{(formula 1)}$$

In the formula, Ic0 is a threshold current for causing the spin-torque magnetization reversal; η is a spin polarization rate; e is a charge of electron; Ms is a saturation magnetization of the magnetization M14; V is a volume of the storage layer 14; and μB is a Bohr magneton.

The left side of the formula corresponds to the number of spins to be injected into the storage layer 14. The right side of the formula corresponds to the number of spins that exist in the storage layer 14. It should be noted that this number of spins is scaled by logarithms. As the excitation energy E, a value corresponding to the direction of the magnetization at the time when the current was made to flow is used.

As can be seen from the formula 1, as the excitation energy E approaches zero, the reversal time is expands infinitely. As described above, when there is almost no thermal fluctuation, since the magnetization M14 would be directed along the easy magnetization axis, which is E=0, the expansion of the reversal time may be a problem.

Here, the excitation energy E of a case in the presence of the thermal fluctuation will be described. The excitation energy E will be a finite value due to the thermal fluctuation. In cases where the storage layer is made of a single ferromagnetic layer, a probability that the excitation energy E is smaller than a certain value X is given by: 1−exp(−X).

Here, "exp" is exponential function. From the formula 1, the excitation energy E required for the reversal in the reversal time ts when a certain current I is made to flow will be represented by X. Then, when the current I is made to flow for the time ts, at a probability of 1−exp(−X), magnetization reversal would not occur. That is, a write-error rate becomes 1−exp(−X). Thus, the excitation energy E is bound in close association with the write-error rate.

In order to prevent such an expansion of the reversal time, the present disclosure has a magnetization fixed layer configured with two ferromagnetic layers laminated interposing a coupling layer therebetween. The two adjacent ferromagnetic layers are magnetically coupled interposing the coupling layer inserted therebetween.

According to such a configuration of the present disclosure, by the magnetic coupling between the ferromagnetic layers forming the magnetization fixed layer, a direction of magnetization of the magnetization fixed layer can be tilted from a direction perpendicular to the film surface. This makes it possible to prevent expansion of the time required for the magnetization reversal, which expansion may be because of the directions of magnetization of the storage layer and the magnetization fixed layer being substantially parallel or antiparallel.

Thus, it makes it possible to perform writing of information by reversing the direction of magnetization of the storage layer in a predetermined finite time.

3. First Embodiment (Specific Configuration Example 1)

Hereinafter, some specific embodiments of the present disclosure will be described.

The embodiments include a first configuration example (first embodiment) and a second configuration example (second embodiment), as specific configuration examples.

Figure 5:
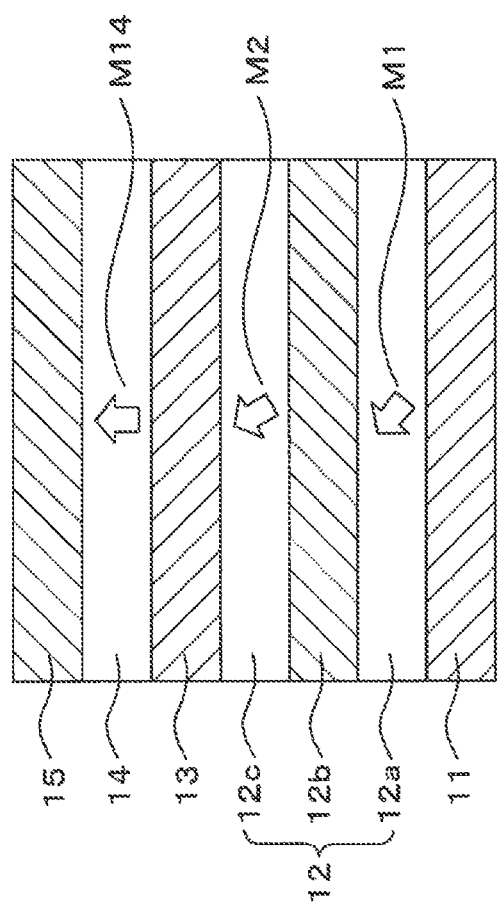
FIG. 5 A schematic diagram (cross-sectional view) of a storage element as a first embodiment.

FIG. 5 shows a schematic diagram (cross-sectional view) of a storage element 3 as a first embodiment.

It should be noted that the same part as what was already described in the above will be denoted by the same reference symbols and the description thereof will be omitted.

In FIG. 5, the storage element 3 of the first embodiment includes the base layer 11, and, the magnetization fixed layer (reference layer) 12, the intermediate layer 13 (nonmagnetic layer: tunnel insulating layer), the storage layer (magnetization free layer) 14 having a direction of magnetization M14 which is variable, and the cap layer 15, which are laminated on top of the base layer 11 in this order.

The storage layer 14 has an easy magnetization axis in a direction perpendicular to the film surface (in an upward direction of the figure in this case). The magnetization M14 of the storage layer 14 directs in the direction perpendicular to the film surface.

The configuration described so far is similar to that of the storage element 3'.

Furthermore, in the storage element 3 of this embodiment, the magnetization fixed layer 12 is made of a multilayer film having a plurality of ferromagnetic layers and a coupling layer being laminated. Specifically, the magnetization fixed layer 12 in this case is made of a three-layered structure having a ferromagnetic layer 12a, a coupling layer 12b and a ferromagnetic layer 12c as shown in the figure. In such a configuration, magnetization M1 of the ferromagnetic layer 12a and magnetization M2 of the ferromagnetic layer 12c are magnetically coupled interposing the coupling layer 12b therebetween. As the coupling layer 12b, a nonmagnetic metal such as Ta and Ru may be used.

A material that can be used as the intermediate layer 13 between the magnetization fixed layer 12 and the storage layer 14 may be an insulating material for forming a tunnel insulating film (various oxides or the like), or, a nonmagnetic metal which is used between magnetic layers of a magneto-resistive element.

When an insulating material is used as the material of the intermediate layer 13, as described above, it makes it possible to provide larger readout signal (resistance change rate), and enable recording with lower current.

For the magnetization fixed layer 12 and the storage layer 14, a variety of magnetic materials as those that have been used in the MTJ of the STT-MRAMs in the past can be used.

For example, CoFe or CoFeB may be used as the magnetization fixed layer 12 and the storage layer 14.

Otherwise, materials such as NiFe, Te Pt, CoPt, TbFeCo, GdFeCo, CoPd, MnBi, MnGa, PtMnSb and Co—Cr materials may be employed. In addition, magnetic materials other than these may also be used.

Read-out of the information may be performed by using magnetoresistance effect.

That is, as in the above-described case of the recording of the information, a current is allowed to flow in the direction perpendicular to the film surfaces of the layers (lamination direction of the layers). Then, it uses the phenomenon that the electric resistance of the storage element changes depending on a relative angle formed by the magnetization M12 of the magnetization fixed layer 12 and the magnetization M14 of the storage layer 14, which layers are adjacent to each other interposing the intermediate layer 13.

Figure 6:
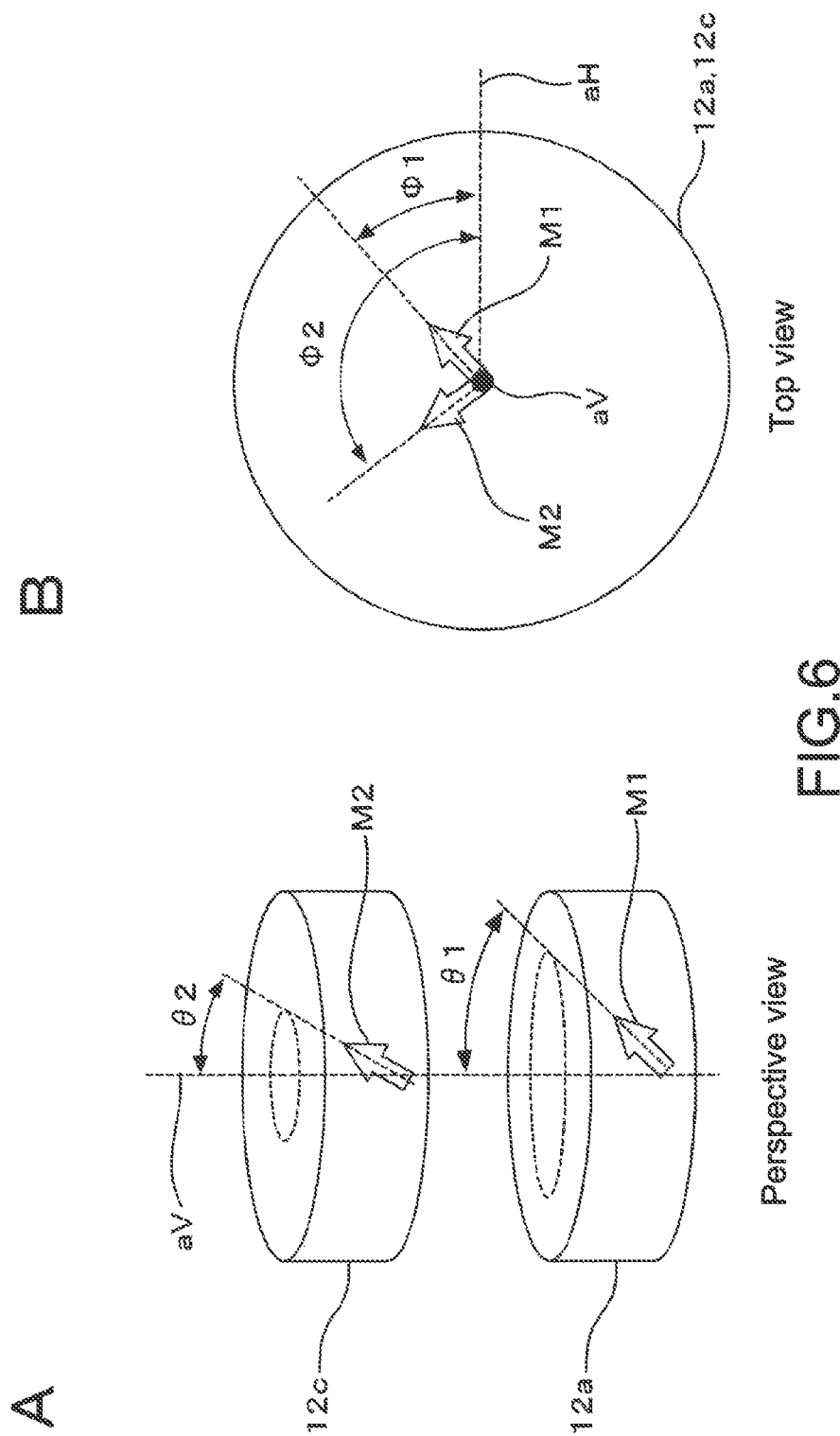
FIG. 6 Figures showing a configuration of a magnetization fixed layer of the first embodiment in detail.

FIG. 6 illustrate the configuration of the magnetization fixed layer 12 of this example in more detail.

Specifically, FIG. 6A is a perspective view of the magnetization fixed layer 12. FIG. 6B is a top view of the magnetization fixed layer 12. For simplification, here, the coupling layer 12b is omitted.

In the storage element 3 of this embodiment, the shape of the magnetization fixed layer 12 may be a cylindrical shape. However, an elliptical shape, a rectangular shape and other shapes are also possible. Here, in order to describe the directions of the magnetizations M1 and M2, the following angles θ1, θ2, φ1 and φ2 will be defined.

First, in the perspective view of FIG. 6A, a vertical axis aV penetrating the magnetization fixed layer 12 in a direction perpendicular thereto is shown. The vertical axis aV corresponds to the easy magnetization axis of the storage layer 14. An angle formed by the magnetization M1 and the vertical axis aV is defined as θ1. An angle formed by the magnetization M2 and the vertical axis aV is defined as θ2.

Further, in the top view of FIG. 6B, a reference line aH which passes through the center of the ferromagnetic layers 12a and 12c is shown. As cross-sectional shapes of the ferromagnetic layers 12a and 12c are substantially circular shapes, a direction of the reference line aH may be arbitrarily selected. If the magnetizations M1 and M2 are supposed to be projected on the film surface, an angle formed by the magnetization M1 and the reference line aH is defined as φ1, and an angle formed by the magnetization M2 and the reference line aH is defined as φ2.

As described above, magnetic materials have a magnetic energy associated with the direction of magnetization thereof. The following values will be defined in order to describe the magnetic energy.

That is, an energy difference calculated by subtracting a magnetic energy in a state where the magnetization M1 is directed perpendicularly (θ1=90 degrees) to the film surface, from a magnetic energy in a state where the magnetization M1 is directed within the film surface (θ1=0 degrees), is defined as Δ1.

An energy difference calculated by subtracting a magnetic energy in a state where the magnetization M2 is directed perpendicularly (θ2=90 degrees) to the film surface, from a magnetic energy in a state where the magnetization M2 is directed within the film surface (θ2=0 degrees), is defined as Δ2.

Furthermore, an intensity of a magnetic coupling energy of the magnetization M1 and the magnetization M2 is defined as Δex.

The unit of Δ1, Δ2 and Δex are joule (J), but in the same manner as for the excitation energy E and the index of heat stability Δ, these will be divided by a heat energy (product of the Boltzmann constant and the absolute temperature), to be used as a dimensionless quantity.

In the storage element 3' of the past, the direction of magnetization of the magnetization fixed layer 12 has been fixed along the easy magnetization axis of the storage layer 14 (see the magnetization M12 of FIG. 4). This would cause the directions of magnetization of the magnetization fixed layer 12 and the storage layer 14 to be the same direction, and would lead to increase in the reversal time.

However, as a result of carrying out various examinations, it was found that, with the configuration of the magnetization fixed layer 12 according to the embodiment as shown in FIG. 5, the angles of the magnetizations M1 and M2 with respect to the easy magnetization axis, which is the vertical axis aV, of the storage layer 14 may also be some angles other than parallel (0 degrees) or antiparallel (180 degrees). In other words, the directions of the magnetizations M1 and M2 may be oblique directions.

In such cases, it can be expected that since the directions of the magnetization M12 of the magnetization fixed layer 12 and the magnetization M14 of the storage layer 14 form a finite angle, the spin torque would not become zero, and thus the increase of the reversal time may be suppressed.

Here, as a result of carrying out various examinations regarding conditions where the directions of the magnetizations would be oblique to each other, the following findings were revealed.

First, a case where the intensity of the magnetic coupling energy Δex of the magnetization M1 and the magnetization M2 is zero, that is, a case where each of the magnetization M1 and the magnetization M2 moves independently, will be assumed.

From the definition, in cases where Δ1 is positive, an easy magnetization axis of the magnetization M1 is perpendicular to the film surface, and the magnetization M1 directs in the direction perpendicular to the film surface. Conversely, in cases where Δ1 is negative, the easy magnetization axis of the magnetization M1 is within the film surface, and the magnetization M1 is directed within the film surface. In these cases, since the ferromagnetic layer 12a is isotropic with respect to rotation around the vertical axis, the value of φ1 may be an arbitrary value.

Similarly, in cases where Δ2 is positive, an easy magnetization axis of the magnetization M2 is perpendicular to the film surface, and the magnetization M2 directs in the direction perpendicular to the film surface. Conversely, in cases where Δ2 is negative, the easy magnetization axis of the magnetization M2 is within the film surface, and the magnetization M2 is directed within the film surface. In these cases, since the ferromagnetic layer 12c is isotropic with respect to rotation around the vertical axis, the value of φ2 may be an arbitrary value.

Next, a case where the intensity of the magnetic coupling energy Δex of the magnetization M1 and the magnetization M2 is other than zero, where each of the magnetization M1 and the magnetization M2 moves in connection with each other, which is an original case of the present disclosure, will be assumed.

From the definition, in cases where Δex is positive, the directions of the magnetizations M1 and M2 tries to be parallel. Conversely, in cases where Δex is negative, the directions of the magnetizations M1 and M2 tries to be antiparallel. The former may be referred to as "ferromagnetic coupling" and the latter may be referred to as "anti-ferromagnetic coupling".

In the following discussion, for ease of illustration, the cases where Δex is positive will be considered. However, the same discussion holds true in the cases where Δex is negative.

Incidentally, if Δex is positive, it shows φ1−φ2=0. If Δex is negative, it shows φ1−φ2=180 degrees.

In cases where Δ1 and Δ2 are both positive, a magnetization angle would be parallel to the vertical axis, regardless of magnitude of Δex. This would be the same as in the storage layer 3' having the magnetization fixed layer 12 that has been described with reference to FIG. 4, and the increase of the reversal time might be inevitable.

On the other hand, in cases where Δ1 and Δ2 are both negative, the magnetization angle would be within the film surface, regardless of magnitude of Δex. This would cause the relative angle formed by the magnetization M2 of the ferromagnetic layer 12c and the magnetization M14 of the storage layer 14 to be constant at 90 degrees, regardless of the value of φ2. Because of this, changes in resistance by magnetoresistance effect would not occur, and therefore, the information is not able to be read out. This might not be able to be used as a storage element which makes up a STT-MRAM.

Thus, as described above, in the storage element according to the present disclosure, Δ1 and Δ2 are supposed to have different signs.

In cases where Δ1 and Δ2 have different signs in this way, a magnetization of one ferromagnetic layer would have an easy magnetization axis perpendicular to the film surface, and a magnetization of another ferromagnetic layer would have an easy magnetization axis within the film surface. By coupling, with Δex, these two magnetizations having the directions competing with each other, it is possible to tilt these magnetizations into oblique directions.

However, it should be noted that there is an upper limit of Δex. If Δex were to have infinite magnitude, the magnetizations M1 and M2 should be parallel to each other; and in such a case, the easy magnetization axis in total would become perpendicular to the film surface or within the film surface, depending on magnitude relationship of Δ1 and Δ2. Even in cases where Δex is not infinite, when Δex is greater than or equal to a certain value, the magnetizations M1 and M2 would be parallel to each other.

In view of this, in order to find the upper limit of Δex, the values $\Delta ex_{max}$ as the upper limit thereof which makes the magnetizations M1 and M2 parallel were calculated with respect to various combinations of Δ1 and Δ2.

Figure 7:
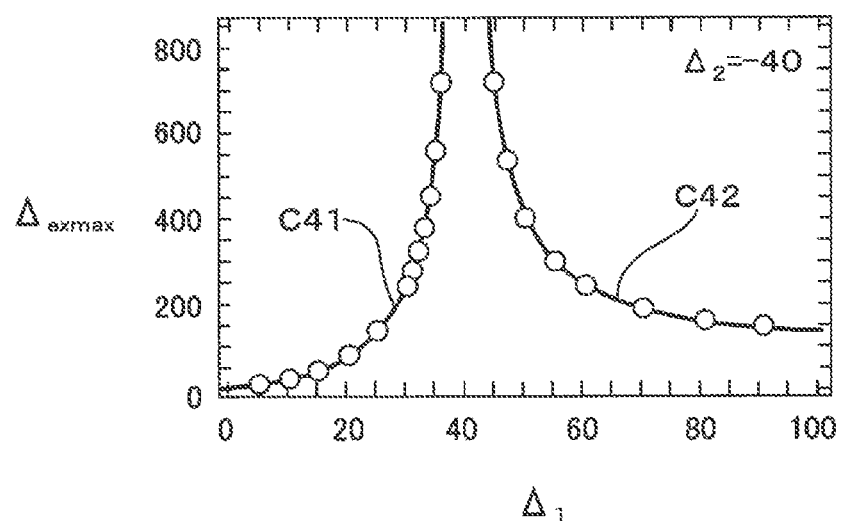
FIG. 7 A figure where a range of magnetic coupling energy is plotted.

FIG. 7 shows one example of the results.

In FIG. 7, Δ2 was fixed to −40 and Δ1 was changed from 0 to 100. A white circle indicates an upper limit of Δex found by calculation. When Δex is smaller than this value, the magnetizations M1 and M2 may be oblique directions. The Δ1-dependency of $\Delta ex_{max}$ may differ according to whether Δ1+Δ2 is smaller or greater in comparison to zero. A curve C41 is the Δ1-dependency of $\Delta ex_{max}$ in cases where Δ1+Δ2 is smaller than zero. A curve C42 is the Δ1-dependency of $\Delta ex_{max}$ in cases where Δ1+Δ2 is greater than zero.

By searching a formula that can fit to these curves, the curves C41 and C42 were both revealed to be expressible by:

$$\Delta ex_{max} = abs(2 \times \Delta 1 \times \Delta 2/(\Delta 1 + \Delta 2)) \quad \text{(formula 2)}.$$

Here, abs is a function that returns an absolute value. Although the cases where Δex is positive are considered here, the same formula applies to the cases where Δex is negative.

After all, the condition for making the magnetizations M1 and M2 into the oblique direction would be, from the above formula 2, as follows:

$$abs(\Delta ex) < abs(2 \times \Delta 1 \times \Delta 2/(\Delta 1 + \Delta 2)) \quad \text{(formula 3)}.$$

From the above, the condition for making the magnetizations M1 and M2 into the oblique direction was revealed. When Δ1, Δ2 and Δex which satisfy this condition are provided, it makes it possible to realize the magnetization fixed layer 12 with its magnetization tilted to oblique direction from the easy magnetization axis of the storage layer 14.

In other words, the magnetization fixed layer 12 of this embodiment is configured to have different signs of Δ1 and Δ2, and also have Δ1, Δ2 and Δex which satisfy the condition of the above formula 3.

According to the first embodiment as described above, the magnetization fixed layer 12 in each storage element 3 which makes up a memory cell of a storage apparatus has a laminated structure of the ferromagnetic layer 12a, the coupling layer 12b and the ferromagnetic layer 12c.

By making it into the laminated structure, the magnetization M1 of the ferromagnetic layer 12a and the magnetization M2 of the ferromagnetic layer 12c may have the directions tilted from the direction perpendicular to the film surface.

This can avoid a phenomenon that the spin torque to the magnetizations M1 and M2 does not work.

Therefore, it makes it possible to record information by reversing the directions of magnetizations M1 and M2 in a predetermined finite time.

Accordingly, with this embodiment, as it makes it possible to perform writing of information by reversing the direction of magnetization of the storage layer in a predetermined time, write errors can be reduced and writing operation may be made in a shorter time.

Since the write errors can be reduced, it can improve reliability of writing operation.

Further, since the writing operation may be made in a shorter time, it can realize high-speed operation.

Therefore, it makes it possible to realize a storage apparatus and a storage apparatus which are highly reliable in writing operation and operate at high speed.

4. Second Embodiment (Specific Configuration Example 2)

Next, a second embodiment will be described.

Figure 8:
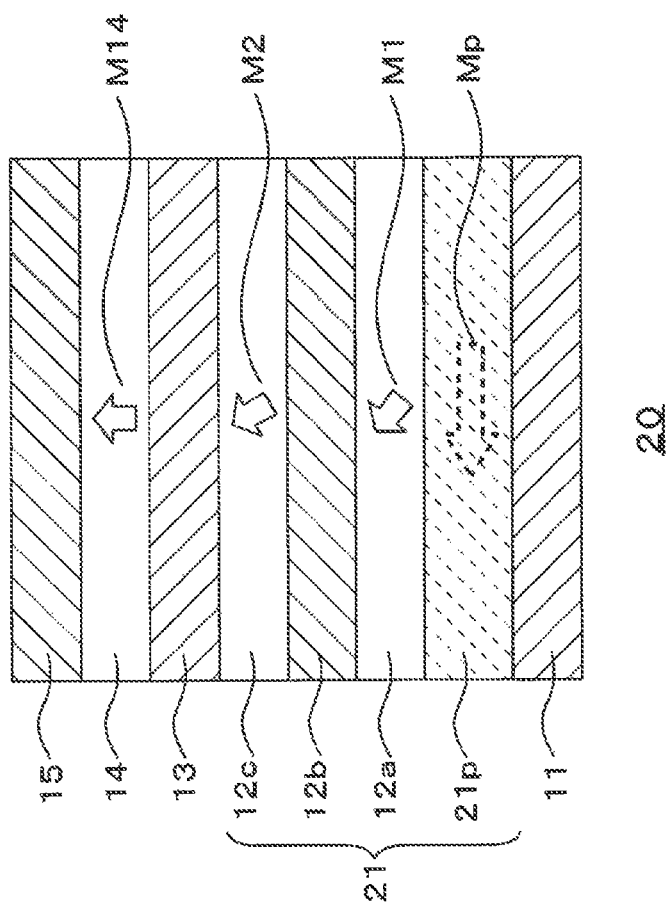
FIG. 8 A schematic diagram (cross-sectional view) of a storage element of a second embodiment.

FIG. 8 is a schematic diagram (cross-sectional view) of a storage element 20 of a second embodiment.

The storage element 20 of the second embodiment is different from the storage element 3 of the first embodiment shown in FIG. 5 above, in that the magnetization fixed layer 12 was replaced with a magnetization fixed layer 21.

The magnetization fixed layer 21 of the storage element 20 is made of a four-layered structure having an antiferromagnetic layer 21p, the ferromagnetic layer 12a, the coupling layer 12b and the ferromagnetic layer 12c being laminated in this order.

The antiferromagnetic layer 21p is provided for fixing the direction of magnetization in the film surface of the magnetization fixed layer 21. An orientation vector Mp in the figure shows the direction in which the magnetization would be fixed, and the direction is within the film surface.

As described above, the intensity of the magnetic coupling energy of the magnetization M1 and the magnetization M2 is Δex. Similarly, the intensity of the magnetic coupling energy of the magnetization M1 and the antiferromagnetic layer 21p will be Δpin. This Δpin will also be used as a dimensionless quantity by being divided by a heat energy (product of the Boltzmann constant and the absolute temperature).

Figure 9:
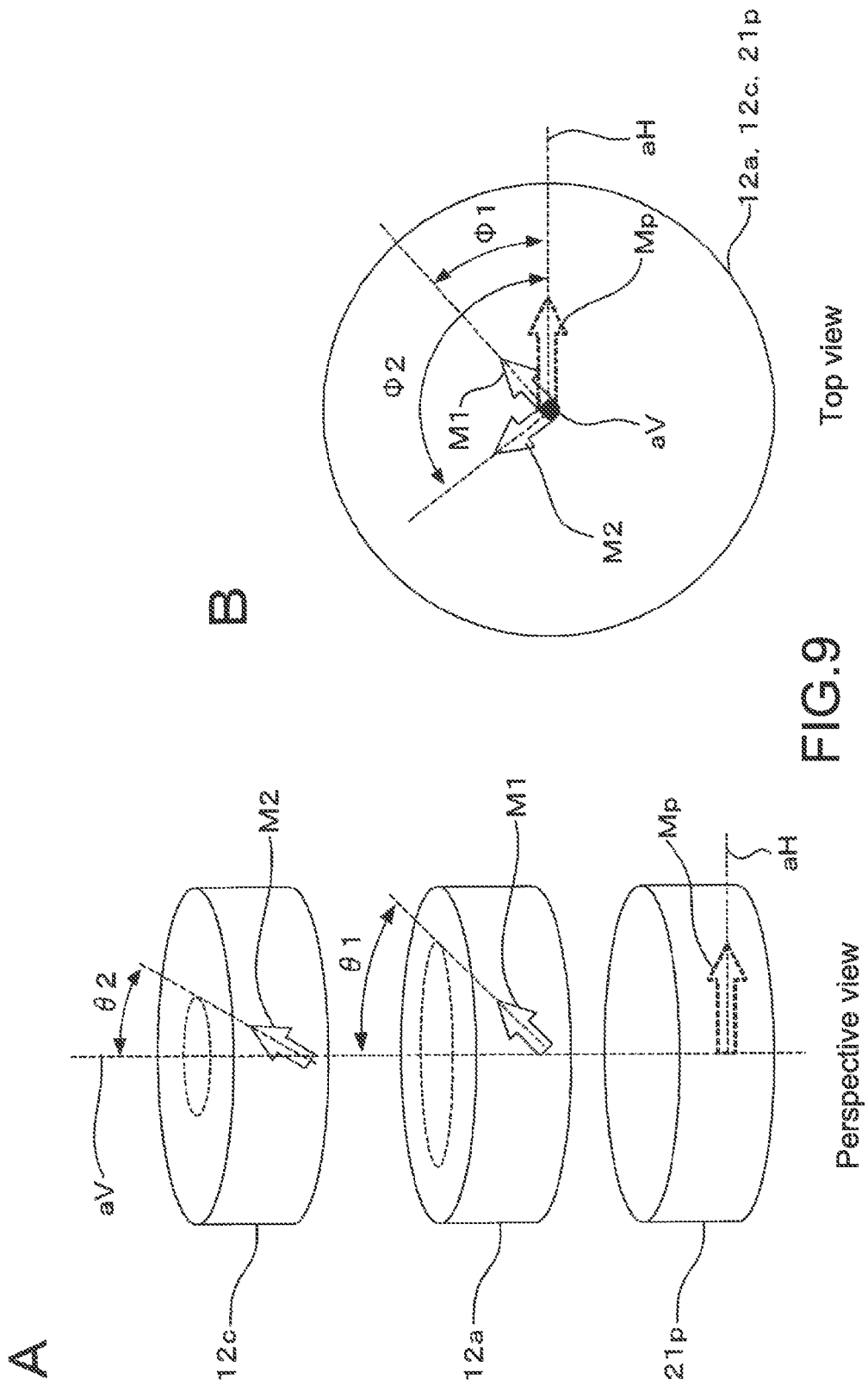
FIG. 9 Figures showing a configuration of a magnetization fixed layer of the second embodiment in detail.

FIG. 9 illustrate the configuration of the magnetization fixed layer 21 in more detail. FIG. 9A is a perspective view of the magnetization fixed layer 21. FIG. 9B is a top view of the magnetization fixed layer 21. For simplification, here, the coupling layer 12b is omitted, in the same manner as in the case of FIG. 6.

Similarly to the magnetization fixed layer 12, the shape of the magnetization fixed layer 21 may be a cylindrical shape. However, an elliptical shape, a rectangular shape and other shapes are also possible.

Here, in order to describe the directions of the magnetizations M1 and M2, the following angles θ1, θ2, φ1 and φ2 will be defined. In the perspective view of FIG. 9A, a vertical axis aV penetrating the magnetization fixed layer 21 in a direction perpendicular thereto is shown. The vertical axis aV corresponds to the easy magnetization axis of the storage layer 14. An angle formed by the magnetization M1 and the vertical axis aV is defined as θ1. An angle formed by the magnetization M2 and the vertical axis aV is defined as θ2.

Further, in FIGS. 9A and 9B, a reference line aH which passes through the center of the ferromagnetic layers 21a and 21c is shown. As the reference line aH, the line which corresponds to the orientation vector Mp is selected. If the magnetizations M1 and M2 are supposed to be projected on the film surface, an angle formed by the magnetization M1 and the reference line aH is defined as φ1, and an angle formed by the magnetization M2 and the reference line aH is defined as φ2.

In the above-described first embodiment, the angles θ1 and θ2 of the magnetizations M1 and M2 of the magnetization fixed layer 12 with respect to the vertical axis aV were fixed, but the angles φ1 and φ2 around the vertical axis aV were not fixed.

Now, the rings of dotted lines shown in the perspective view of FIG. 9A indicate the respective loci of the magnetizations M1 and M2. The magnetizations M1 and M2 may be oriented at any direction on the dotted lines (with the proviso that if Δex is positive, it satisfies the condition of φ1−φ2=0; and if Δex is negative, it satisfies the condition of φ1−φ2=180 degrees).

In the second embodiment, the angles φ1 and φ2, around the vertical axis aV, of the magnetizations M1 and M2 of the magnetization fixed layer 21 are fixed by the antiferromagnetic layer 21p.

In FIG. 9B, the angles φ1 and φ2 around the vertical axis aV are the angles with respect to the orientation vector Mp which indicates the direction in which the magnetization is fixed. Then, since the magnetization M1 is fixed in the direction of the orientation vector Mp by the antiferromagnetic layer 21p, it shows φ1=0. Since the magnetization M2 is magnetically coupled to the magnetization M1 via the coupling layer 12b, if Δex is positive, it shows φ2=0; and if Δex is negative, it shows φ2=180 degrees.

In such a manner, the storage element 20 of the second embodiment makes it possible to fix the angles, around the vertical axis aV, of the magnetizations M1 and M2 of the magnetization fixed layer 21 (angles within the film surface), in a certain direction.

By fixing the angles of the magnetizations M1 and M2 around the vertical axis aV, it allows magnitude of an inversion current to be reduced. That is, it makes it possible to reduce the value of the threshold current (Ico in the FIG. 1) for causing the spin-torque magnetization reversal.

5. Simulation Result

A simulation was carried out in order to reveal an effect of the storage elements (3 and 20) of each of the above-described embodiments.

Figure 10:
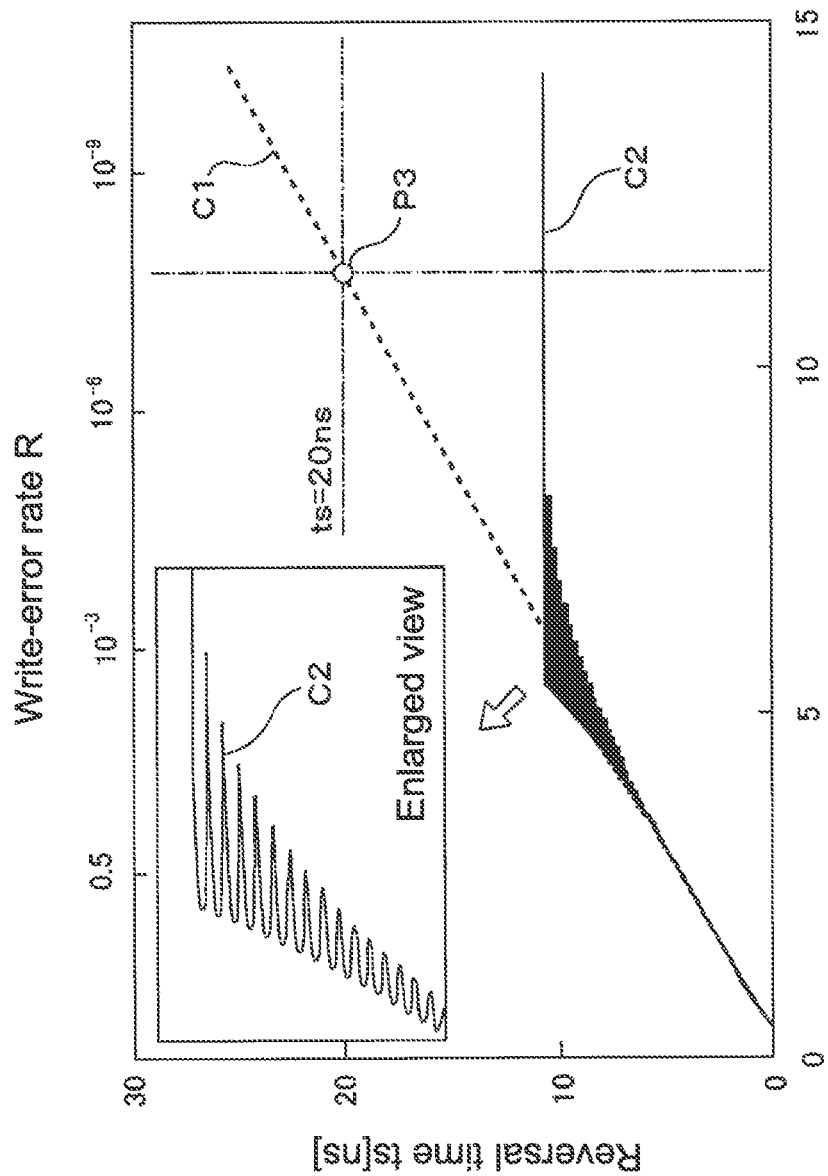
FIG. 10 A figure showing a relationship between excitation energy and reversal time, at a certain current.

FIG. 10 shows a relationship between the excitation energy E and the reversal time ts, at a certain current. The abscissa was expressed by $\ln[(\pi/2)(\Delta/E)1/2]$, by following the formula 1. Further, the Δ of the storage layer 14 was 60.

As the excitation energy E, a value calculated based on the direction of the magnetization at the time when the current was made to flow in the storage element would be used. The direction of the magnetization may be shifted from a state of equilibrium due to the thermal fluctuation. A larger excitation energy E (leftward in FIG. 10) indicates larger shift thereof.

In the storage element 3' of the past, the relationship between the excitation energy E and the reversal time is would be expressed by the above formula 1. A curve C1 shows the simulation result regarding the storage element 3' of the past. If the abscissa is scaled by the logarithm of the excitation energy E, the curve C1 becomes almost linear. It can be seen that the larger the excitation energy E is, the shorter the time for reversal becomes.

Now, a case where a supply time of current is 20 ns is assumed. Then, an intersection with the curve C1 will be a point P3. The value of the abscissa at this point is about 11.5. If the excitation energy E is calculated from this, and if the write error rate is also calculated, the write error rate becomes $1.5 \times 10^{-8}$.

Since the number of writing times which may be required for a random access memory is about $10^{15}$ times, this value of write error rate is not negligible. In a supply time of another current, as the position of the point P3 changes, the write error rate would change according to that.

In such a manner, in the storage element 3' of the past, the write error rate would change according to the supply time of the current. The shorter the supply time of the current is, the greater the write error rate becomes.

In contrast, the relationship between the excitation energy E and the reversal time ts in cases where a storage element according to an embodiment of the present disclosure was used is indicated by a curve C2.

It should be noted that the curve C2 shows an example of calculation regarding a case where the storage element 20 of the second embodiment was used. In this case, the direction of the magnetization M2 of the ferromagnetic layer 12c was assumed to be tilted by 5 degrees from the vertical axis.

Referring to this curve C2, different from the curve C1 for the storage element 3' of the past, it can be seen that an increase in the reversal time ts when the excitation energy E decreased was stopped at about 10 ns. This is because, since the direction of the magnetization M2 is tilted from the direction of the magnetization M14 of the storage layer 14 (vertical axis) even when the excitation energy E is zero (positive infinity in the abscissa of FIG. 10), a finite spin torque would work.

In the example of calculation illustrated by the curve C2 of FIG. 10, when the value of the abscissa was about 5 or more, the reversal time ts was about 10 ns and was substantially constant. This means that regardless of whichever direction the magnetization M14 of the storage layer 14 is oriented to at the time when the current is made to flow, the reversal time ts is not likely to exceed 10 ns.

In such a manner, in the storage element of the embodiment, an upper limit of the reversal time ts (as 10 ns in the example of calculation in FIG. 10) may be determined regardless of the direction of the magnetization at the time when the current is made to flow. Therefore, when the supply time of the current is greater than or equal to this upper limit value, writing may be performed without generating write errors.

From this point of view as well, it can be seen that the storage element of the embodiment makes it possible to realize writing operation in a shorter time than in the storage element 3' of the past, without generating write errors.

It should be noted that although FIG. 10 showed a simulation result regarding the case where the storage element 20 of the second embodiment was used, substantially the same result would also be obtained in the case where the storage element 3 of the first embodiment was used.

6. Variation Examples

As described above, some embodiments according to the present disclosure have been illustrated. However, the present disclosure should not be limited to the specific examples illustrated above.

For example, in the description so far, some cases of applying, to the laminated structure of the ferromagnetic layer and the coupling layer in the magnetic fixed layer 12 of the storage element 3 or 20, the three-layered structure of the ferromagnetic layer 12a, the coupling layer 12b and the ferromagnetic layer 12c, have been illustrated. However, any number of layers, other than the three-layered structure as well, may be applied to the laminated structure.

Further, in the description so far, as the laminated structure regarding the whole storage element, a laminated structure in which at least the magnetization fixed layer 12 (21), the intermediate layer 13 and the storage layer 14 were disposed in this order from the lower layer, was employed. However, in a storage element of the present disclosure, the arrangement of the layers in the reversed order is also possible.

In addition, although the structure of the storage element 3 or the storage element 20 according to the present disclosure is configured as a magneto-resistive element such as TMR elements, this magneto-resistive element as a TMR element may be applied to apparatuses other than the above-described storage apparatus. It can be applied to a magnetic head and a hard disk drive equipped with this magnetic head; an integrated circuit chip; and various electronic apparatuses and electric apparatuses such as a personal computer, a mobile terminal, a mobile phone and a magnetic sensor apparatus.

Figure 11:
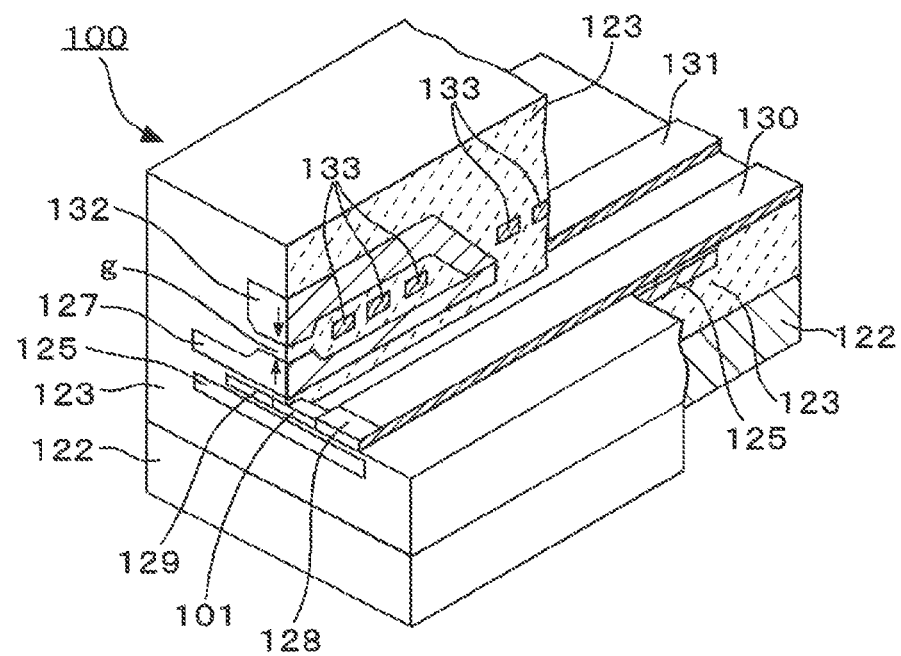
FIG. 11 Figures showing an application example of a storage element (magneto-resistive element) of an embodiment applied to a composite magnetic head.
Figure 11:
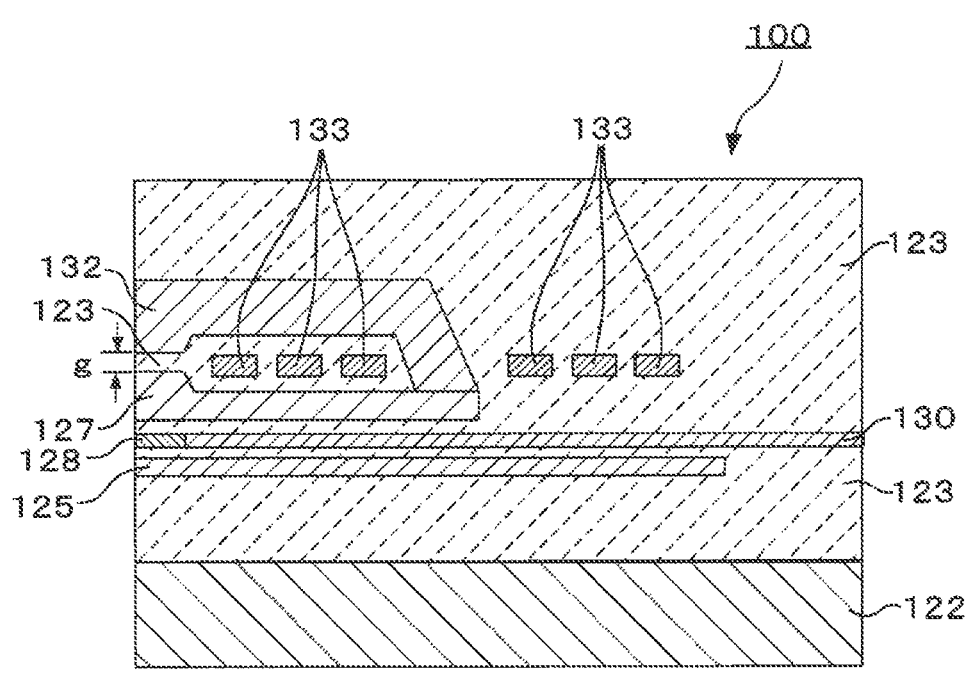

As an example, FIGS. 11A and 11B show a case where a magneto-resistive element 101 having a structure of the above-described storage element 3 or 20 is applied to a composite magnetic head 100. It should be noted that FIG. 11A is a perspective view showing the composite magnetic head 100 in a form with its part cut out so that an internal structure thereof can be understood. FIG. 11B is a cross-sectional view of the composite magnetic head 100.

The composite magnetic head 100 is a magnetic head which is used in a hard disk apparatus or the like. The composite magnetic head 100 is made with a magneto-resistive magnetic head according to the present disclosure formed on a substrate 122, and with an inductive magnetic head formed by lamination on the magneto-resistive magnetic head. Here, the magneto-resistive magnetic head operates as a reproducing head and the inductive magnetic head operates as a recording head. That is, the composite magnetic head 100 is configured by combining a reproducing head and a recording head.

The magneto-resistive magnetic head mounted on the composite magnetic head 100 is a so-called shielded MR head, and includes a first magnetic shield 125 formed over the substrate 122 with an insulating layer 123 interposed between the substrate 122 and the first magnetic shield 125; the magneto-resistive element 101 formed over the first magnetic shield 125 with the insulating layer 123 interposed between the first magnetic shield 125 and the magneto-resistive element 101; and a second magnetic shield 127 formed over the magneto-resistive element 101 with the insulating layer 123 interposed between the magneto-resistive element 101 and the second magnetic shield 127. The insulating layer 123 may be made of an insulating material such as $Al_2O_3$ and $SiO_2$.

The first magnetic shield 125 is provided for magnetically shielding lower layers with respect to the magneto-resistive element 101. The first magnetic shield 125 may be made of a soft magnetic material such as Ni—Fe. Over this first magnetic shield 125, the magneto-resistive element 101 is formed interposing the insulating layer 123.

The magneto-resistive element 101 in this magneto-resistive magnetic head would function as a magneto-sensitive element for detecting magnetic signals from a magnetic recording medium. This magneto-resistive element 101 may have substantially the same film structure (layer structure) as the above-described storage element 3 or 20.

This magneto-resistive element 101 may be formed in a substantially rectangular shape, and one side surface thereof is exposed to a magnetic recording medium facing surface. In addition, bias layers 128 and 129 are disposed at both ends of the magneto-resistive element 101. Further, connection terminals 130 and 131 connected to the respective bias layers 128 and 129 are formed. Through the connection terminals 130 and 131, a sense current would be supplied to the magneto-resistive element 101.

Furthermore, above the bias layers 128 and 129, a layer of the second magnetic shield 127 is provided interposing the insulating layer 123.

The inductive magnetic head formed by lamination on such a magneto-resistive magnetic head includes a magnetic core and a thin film coil 133. The magnetic core is made up of the second magnetic shield 127 and an upper core 132. The thin film coil 133 is formed wound around the magnetic core.

The upper core 132 would form a closed magnetic circuit with the second magnetic shield 122 to serve as the magnetic core of this inductive magnetic head. The upper core 132 made of a soft magnetic material such as Ni—Fe. Here, the second magnetic shield 127 and the upper core 132 are formed so that their front end portions are exposed to the magnetic recording medium facing surface, and, so that the second magnetic shield 127 and the upper core 132 are in contact with each other at their rear end portions. The front end portions of the second magnetic shield 127 and the upper core 132 are formed so that, in the magnetic recording medium facing surface, the second magnetic shield 127 and the upper core 132 are spaced from each other by a predetermined gap g.

That is, in this composite magnetic head 100, the second magnetic shield 127 would also serve as a magnetic core of an inductive magnetic head, in addition to magnetically shielding upper layers with respect to the magneto-resistive element 101. The magnetic core of the inductive magnetic head is made up of the second magnetic shield 127 and the upper core 132. Further, the gap g would be a magnetic recording gap of the inductive magnetic head.

In addition, above the second magnetic shield 127, the thin film coil 133 is formed embedded in the insulating layer 123. Here, the thin film coil 133 is formed wound around the magnetic core made up of the second magnetic shield 127 and the upper core 132. Although not shown in the figure, both ends of the thin film coil 133 are exposed to the outside. Terminals formed at the both ends of the thin film coil 133 would be external connection terminals of this inductive magnetic head. That is, at the time of recording magnetic signals to the magnetic recording medium, a recording current would be supplied to the thin film coil 132 from these external connection terminals.

As described above, a laminated structure as the storage element of the present disclosure may be applied to a reproducing head for a magnetic recording medium, that is, a magneto-sensitive element for detecting magnetic signals from a magnetic recording medium.

In addition, the present disclosure may employ the following configuration.

(1) A storage element including
a layer structure at least including a storage layer having a direction of magnetization to be changed according to information, a magnetization fixed layer having a fixed direction of magnetization, the magnetization fixed layer having two ferromagnetic layers laminated interposing a coupling layer therebetween, the ferromagnetic layers being magnetically coupled interposing the coupling layer, the ferromagnetic layers having a direction of magnetization being tilted from a direction perpendicular to a film surface; and an intermediate layer containing a nonmagnetic material disposed between the storage layer and the magnetization fixed layer, in which recording of the information is to be performed by allowing a current to flow in the layer structure in its lamination direction to cause change in the direction of magnetization of the storage layer.

(2) The storage element according to (1), in which the magnetization fixed layer has a first ferromagnetic layer, the coupling layer and a second ferromagnetic layer being laminated in this order, the first ferromagnetic layer has a first magnetic energy which is defined to have a value calculated by subtracting a magnetic energy in a state where magnetization of the first ferromagnetic layer is perpendicular to its film surface, from a magnetic energy in a state where magnetization of the first ferromagnetic layer is within its film surface, the second ferromagnetic layer has a second magnetic energy which is defined to have a value calculated by subtracting a magnetic energy in a state where magnetization of the second ferromagnetic layer is perpendicular to its film surface, from a magnetic energy in a state where magnetization of the second ferromagnetic layer is within its film surface, and the first magnetic energy and the second magnetic energy have values with different signs.

(3) The storage element according to (2), in which a magnetic coupling energy of the first ferromagnetic layer and the second ferromagnetic layer interposing the coupling layer is defined as an interlayer magnetic coupling energy, and an absolute value of the interlayer magnetic coupling energy is smaller than an absolute value of twice the value calculated by dividing the product of the first magnetic energy and the second magnetic energy, by the sum of the first magnetic energy and the second magnetic energy.

(4) The storage element according to (1), in which the magnetization fixed layer further includes an antiferromagnetic layer.

(5) The storage element according to (4), in which the magnetization fixed layer has the antiferromagnetic layer, a first ferromagnetic layer, the coupling layer and a second ferromagnetic layer being laminated in this order, the first ferromagnetic layer has a first magnetic energy which is defined to have a value calculated by subtracting a magnetic energy in a state where magnetization of the first ferromagnetic layer is perpendicular to its film surface, from a magnetic energy in a state where magnetization of the first ferromagnetic layer is within its film surface, the second ferromagnetic layer has a second magnetic energy which is defined to have a value calculated by subtracting a magnetic energy in a state where magnetization of the second ferromagnetic layer is perpendicular to its film surface, from a magnetic energy in a state where magnetization of the second ferromagnetic layer is within its film surface, and the first magnetic energy and the second magnetic energy have values with different signs.

(6) The storage element according to (5), in which magnetization of the antiferromagnetic layer and magnetization of the first ferromagnetic layer are magnetically coupled, and a direction of magnetization of the first ferromagnetic layer within the film surface is fixed.

(7) A storage apparatus including:

a storage element having a layer structure at least including a storage layer having a direction of magnetization to be changed according to information, a magnetization fixed layer having a fixed direction of magnetization, the magnetization fixed layer having two ferromagnetic layers laminated interposing a coupling layer therebetween, the ferromagnetic layers being magnetically coupled interposing the coupling layer, the ferromagnetic layers having a direction of magnetization being tilted from a direction perpendicular to a film surface; and an intermediate layer containing a nonmagnetic material disposed between the storage layer and the magnetization fixed layer, in which recording of the information is to be performed by allowing a current to flow in the layer structure in its lamination direction to cause change in the direction of magnetization of the storage layer;

a wiring portion for supplying a current which flows in the lamination direction to the storage element; and a current supply control section for controlling supply of the current to the storage element via the wiring portion.

DESCRIPTION OF REFERENCE SYMBOLS 1 gate electrode
2 element isolation layer
3, 20 storage element
4 contact layer
6 bit line
7 source region
8 drain region
9 wiring
10 semiconductor substrate
11 base layer
12, 21 magnetization fixed layer
12a, 12c ferromagnetic layer
12b coupling layer
13 intermediate layer
14 storage layer
15 cap layer
21p antiferromagnetic layer

The invention claimed is:

1. A storage element comprising:
a layer structure comprising layers arranged in a lamination direction that extends along a vertical axis of the storage element, the layer structure including:
a storage layer having a direction of magnetization that changes according to stored information,
a magnetization fixed layer including first and second ferromagnetic layers, a coupling layer and an antiferromagnetic layer, the first and second ferromagnetic layers being laminated to interpose the coupling layer therebetween, the first and second ferromagnetic layers being magnetically coupled, the first ferromagnetic layer having a first direction of magnetization that extends at a first angle $\theta_1$ from the vertical axis, the second ferromagnetic layer having a second direction of magnetization that is at a second angle $\theta_2$ from the vertical axis, the first direction of magnetization also extending at a third angle $\phi_1$ from a reference direction perpendicular to the vertical axis, the second direction of magnetization also extending at a fourth angle $\phi_2$ from the reference direction, wherein the third angle $\phi_1$ and the fourth angle $\phi_2$ are fixed by the antiferromagnetic layer; and an intermediate layer containing a nonmagnetic material disposed between the storage layer and the magnetization fixed layer.

2. The storage element according to claim 1, wherein the layer structure is configured such that recording of the information is to be performed by current flow in the layer structure in the lamination direction to cause a change in the direction of magnetization of the storage layer.

3. A storage apparatus comprising:
a storage element including a layer structure, the layer structure comprising layers arranged in a lamination direction that extends along a vertical axis of the storage element, the layer structure including:
a storage layer having a direction of magnetization that changes according to stored information,
a magnetization fixed layer including first and second ferromagnetic layers, a coupling layer and an antiferromagnetic layer, the first and second ferromagnetic layers being laminated to interpose the coupling layer therebetween, the first and second ferromagnetic layers being magnetically coupled, the first ferromagnetic layer having a first direction of magnetization that extends at a first angle $\theta_1$ from the vertical axis, the second ferromagnetic layer having a second direction of magnetization that is at a second angle $\theta_2$ from the vertical axis, the first direction of magnetization also extending at a third angle $\phi_1$ from a reference direction perpendicular to the vertical axis, the second direction of magnetization also extending at a fourth angle $\phi_2$ from the reference direction, wherein the third angle $\phi_1$ and the fourth angle $\phi_2$ are fixed by the antiferromagnetic layer; and an intermediate layer containing a nonmagnetic material disposed between the storage layer and the magnetization fixed layer.

4. The storage apparatus according to claim 3, wherein the layer structure is configured such that recording of the information is to be performed by current flow in the layer structure in the lamination direction to cause a change in the direction of magnetization of the storage layer.

* * * * *